United States Patent
Shiraishi et al.

(10) Patent No.: US 8,071,888 B2
(45) Date of Patent: Dec. 6, 2011

(54) ELECTRICALLY CONDUCTIVE INK, ELECTRICALLY CONDUCTIVE CIRCUIT, AND NON-CONTACT-TYPE MEDIUM

(75) Inventors: Kinya Shiraishi, Tokyo (JP); Kaori Nakamura, Tokyo (JP); Kouji Miyabayashi, Tokyo (JP)

(73) Assignee: Toyo Ink. Mfg. Co., Ltd., Tokyo (JP)

( * ) Notice: Subject to any disclaimer, the term of this patent is extended or adjusted under 35 U.S.C. 154(b) by 1120 days.

(21) Appl. No.: 11/886,111

(22) PCT Filed: Mar. 1, 2006

(86) PCT No.: PCT/JP2006/303833
§ 371 (c)(1),
(2), (4) Date: Sep. 11, 2007

(87) PCT Pub. No.: WO2006/095611
PCT Pub. Date: Sep. 14, 2006

(65) Prior Publication Data
US 2008/0169122 A1    Jul. 17, 2008

(30) Foreign Application Priority Data
Mar. 11, 2005    (JP) .................................. 2005-068753

(51) Int. Cl.
*H05K 1/09* (2006.01)
*H01B 1/06* (2006.01)
(52) U.S. Cl. ....................................... 174/257; 252/511
(58) Field of Classification Search ................ 174/257
See application file for complete search history.

(56) References Cited

U.S. PATENT DOCUMENTS

| | | | | |
|---|---|---|---|---|
| 4,476,211 A | * | 10/1984 | Hosoi | 430/137.11 |
| 5,573,996 A | | 11/1996 | Inoue | |
| 5,622,652 A | * | 4/1997 | Kucherovsky et al. | 252/511 |
| 5,851,438 A | * | 12/1998 | Chan | 252/514 |
| 6,132,543 A | * | 10/2000 | Mohri et al. | 156/89.12 |
| 6,228,465 B1 | * | 5/2001 | Takiguchi et al. | 428/209 |
| 2005/0039329 A1 | * | 2/2005 | Koskenmaki et al. | 29/825 |

FOREIGN PATENT DOCUMENTS

| | | |
|---|---|---|
| JP | 61-287971 | 12/1986 |
| JP | 8-002116 | 1/1996 |
| JP | 2000-260224 A | 9/2000 |
| JP | 2001-64547 A | 3/2001 |
| JP | 2001-271015 A | 10/2001 |
| JP | 2002-260442 A | 9/2002 |
| JP | 2003-16836 A | 1/2003 |
| JP | 2003-223812 | 8/2003 |
| JP | 2003-223812 A | 8/2003 |
| JP | 2003223812 A * | 8/2003 |
| WO | PCT/US00/10512 * | 4/1999 |
| WO | WO 00/63308 | 10/2000 |

OTHER PUBLICATIONS

"Metal Nano-Particles," with Partial English translation, Journal of Japan Institute of Electronics Packing, vol. 5, No. 6, pp. 523-528, 2002.

* cited by examiner

*Primary Examiner* — Timothy Thompson
*Assistant Examiner* — Roshn Varghese
(74) *Attorney, Agent, or Firm* — McDermott Will & Emery LLP

(57) ABSTRACT

This invention provides an electrically conductive ink comprising an electrically conductive material and a vinyl chloride/vinyl acetate/hydroxyalkyl (meth)acrylate copolymer resin. There is also provided a noncontact-type medium comprising a base material and, provided on the base material, an electrically conductive circuit formed using the electrically conductive ink, and an IC chip mounted in the state of being electrically conducted to the electrically conductive circuit. An electrically conductive circuit, which is in a thin film form, can be used as an antenna circuit for noncontact-type media, has a low volume resistivity on the order of $10^{-5}$ Ω·cm, and is highly reliable under a high temperature and high humidity environment, can be formed by using the electrically conductive ink at a low temperature in a short time.

11 Claims, No Drawings

ELECTRICALLY CONDUCTIVE INK, ELECTRICALLY CONDUCTIVE CIRCUIT, AND NON-CONTACT-TYPE MEDIUM

RELATED APPLICATIONS

This application is the U.S. National Phase under 35 U.S.C. §371 of International Application No. PCT/JP2006/303833, filed on Mar. 1, 2006, which in turn claims the benefit of Japanese Application No. 2005-068753, filed on Mar. 11, 2005, the disclosure of which Applications is incorporated by reference herein.

TECHNICAL FIELD

The present invention relates to an electrically conductive ink, an electrically conductive circuit using the same, a method of forming the electrically conductive circuit, and a noncontact-type medium having the electrically conductive circuit.

BACKGROUND ART

An electrically conductive coating film has a variety of uses of electromagnetic radiation shielding for cathode-ray tubes, plasma display panels etc., infrared ray shielding for construction materials or automobiles, coverage for preventing electrostatic charging of electronics and cell-phones, heating wires for defogging of glass, wirings on circuit boards etc., coatings for giving electric conductivity to resin, or a circuit itself. As methods of forming such electrically conductive coating films, there have been known conventionally methods such as a vacuum metal deposition method, a chemical vapor deposition method, an ion sputtering method and a method of applying a metallic colloid solution having metallic particles dispersed in a dispersion medium on a base material and then heat-calcining it. These methods have some problems such as cumbersome operation, low mass productivity, and necessity for heating at high temperatures. On the other hand, there have been conducted so far to form wirings on printed boards by etching an electrically conductive film or by using an electrically conductive paste. However, the etching method has problems such as troublesome operation, high cost and liquid waste disposal and is also undesirable from an environmental point of view. Further, the method of using the electrically conductive paste requires necessity for formation of electrically conductive circuits such as wirings by screen process printing which is problematic in productivity, and has another problem of heating at high temperatures after printing in order to attain excellent electric conductivity.

IC cards capable of noncontact reading and rewriting of information, such as banking cash cards, train passes, and various prepaid cards, appear recently in place of cards utilizing a contact-type magnetic recording system, and their demand is increasing. Further, IC tags using this noncontact communication system are also proposed and come into practical use. As the method of recognizing media utilizing this system capable of noncontact reading and rewriting information, that is, noncontact-type media, there are two system at present: an electromagnetic induction system and a radio wave system. In both the systems, media are composed of a IC chip and an antenna, and it is essential that the antenna portion that is an electrically conductive circuit is of low resistance for lowering loss at the time of transmitting and receiving radio waves. The antenna portion that is an electrically conductive circuit of noncontact-type media such as IC cards and IC tags is formed by a method of transferring a metal foil such as copper foil or aluminum foil to a base material or by a method of printing an etching-resist ink in an antenna circuit pattern on a metal foil laminated on a base material such as a plastic film and then etching it. A copper-line coil or a wire may be used as an antenna. However, any of these methods have limits of productivity and are unsuitable for mass production. Further, as described above, there is also a method of utilizing an etching method. The method, however, is not preferable from an environmental point of view because of having the problems such as a liquid waste disposal as described above, and is also problematic in respect of cost.

As another method of forming an electrically conductive circuit for noncontact-type media, a method of screen process printing an electrically conductive paste has been carried out. A polyester resin or an epoxy resin is mainly used as a binder in conventional electrically conductive pastes above, from which a conductive circuit having a volume resistivity on the order of $10^{-5}$ Ω·cm has been obtained (see Patent Documents 1 and 2). However, these conventional electrically conductive pastes require drying conditions of high temperatures of 100° C. or more and several minutes to several dozen minutes, as well as a coating thickness of about 10 μm or more after drying. The method, therefore, have limitations in consideration of cost and mass productivity for use in IC tags. Electrically conductive circuits formed from the conventional electroconductive pastes using a polyester resin or an epoxy resin as a binder have also a problem of low reliability under a high-temperature and high-humidity environment at 85° C. in 85% RH.

On the other hand, it is known recently that a volume resistivity on the order of $10^{-6}$ Ω·cm can be obtained with a relatively thin coating of about 0.1 to 5 μm in thickness by using silver nano-particles (see Non-Patent Document 1). For exhibiting this resistivity, however, sintering of the paste at 200° C. is necessary, thus making this method hardly applicable to usual paper base materials and plastic base materials such as polyester used in IC cards or IC tags. In addition, this method has a problem of inferior adhesiveness to a base material under a high-temperature and high-humidity environment.

There is also an attempt at reducing resistance without influencing a base material, which comprises combining an active energy ray-curable electrically conductive paste using urethane acrylate or the like as a binder with heat pressure roll treatment (see Patent Document 3). However, the resulting electrically conductive circuit has a volume resistivity on the order of $10^{-4}$ Ω·cm, which is too high to cope with a broad range of frequency used in an antenna circuit. There is also a problem of lack of reliability because of instable resistance under a high-temperature and high-humidity environment.

Patent Document 1: Japanese Patent Application Laid-Open (JP-A) No. 2000-260224
Patent Document 2: JP-A-2003-16836
Patent Document 3: JP-A-2001-64547
Non-Patent Document 1: Journal of Japan Institute of Electronics Packaging, Vol. 5, No. 6 (2002), pp. 523-528

Accordingly, an object of the present invention is to provide an electrically conductive ink utilizable in various uses and free of the conventional problems, an electrically conductive circuit using the electrically conductive ink and a noncontact-type medium having an electrically conductive circuit formed by using the electrically conductive ink, as well as a method of forming the electrically conductive circuit.

Specifically, an object of the present invention is to provide an electrically conductive ink, from which an electrically conductive coating that is highly reliable under a high-temperature and high-humidity environment can be formed at low temperatures in a short time.

Another object of the present invention is to provide an electrically conductive ink having the above feature and capable of forming a thin electrically conductive circuit having such a low volume resistivity on the order of $10^{-5}$ Ω·cm as to be usable as an antenna circuit for noncontact-type media.

Still another object of the present invention is to provide an electrically conductive circuit having a low volume resistivity on the order of $10^{-5}$ Ω·cm and being highly reliable under a high-temperature and high-humidity environment, and a method of forming the same.

A further object of the present invention is to provide a noncontact-type medium provided with an electroconductive circuit having a low volume resistivity on the order of $10^{-5}$ Ω·cm and being highly reliable under a high-temperature and high-humidity environment.

DISCLOSURE OF INVENTION

Means for Solving the Problem

An electrically conductive ink of the present invention comprises an electrically conductive material and a vinyl chloride/vinyl acetate/hydroxyalkyl (meth)acrylate copolymer resin.

In the electrically conductive ink of the invention, the electrically conductive material is preferably silver. Further the electrically conductive material preferably comprises (A) electrically conductive fine particles having an average particle diameter of 0.001 to 0.10 μm and (B) electrically conductive powders having an average particle diameter or average circle-equivalent diameter of 0.5 to 10 μm. Furthermore the electrically conductive powders (B) are preferably flake-, scale-, plate-, sphere- or foil-shaped. The electrically conductive ink of the invention may contain an ethylenically unsaturated double bond-containing compound and a photopolymerization initiator.

An electrically conductive circuit of the present invention is formed from the electrically conductive ink of the invention.

In the electrically conductive circuit of the invention, the arithmetic average surface roughness Ra of the circuit is preferably 3.0 μm or less.

A method of forming an electrically conductive circuit according to the present invention comprises formation on a base material by printing with the electrically conductive ink of the invention.

In the method for manufacturing the electrically conductive circuit of the invention, printing is preferably flexographic printing, gravure printing, gravure offset printing, rotary screen process printing or letter press. Preferably, the electrically conductive circuit formed is further heated, pressurized, heated/pressurized, or irradiated with UV ray, whereby the arithmetic average surface roughness Ra of the electrically conductive circuit is reduced to 3.0 μm or less.

A noncontact-type medium of the present invention comprises an electrically conductive circuit formed on a base material by using the electrically conductive ink of the present invention and an IC chip mounted in the state of being electrically conducted to the electrically conductive circuit.

In the noncontact-type medium of the invention, the arithmetic average surface roughness Ra of the electrically conductive circuit formed on a base material is preferably 3.0 μm or less.

EFFECT OF THE INVENTION

The electrically conductive ink of the invention is excellent in electric conductivity. Therefore, an electrically conductive coating and an electrically conductive circuit can be formed at low temperatures in a short time by using the electrically conductive ink of the invention. The electrically conductive ink of the invention is also excellent in adhesiveness to various base materials such as paper and various plastic films. Therefore in the invention, an electrically conductive coating and an electrically conductive circuit can be easily formed on a base material regardless of the type of base material. In addition, the electrically conductive ink of the invention exhibits high electric conductivity even in the form of a thin film. Accordingly a low volume resistivity on the order of $10^{-5}$ Ω·cm applicable to an antenna circuit for noncontact-type media can be obtained at a coating thickness of several μm. Further as the electrically conductive ink of the invention can be produced as an ink suitable for various printing systems, an electrically conductive circuit can be formed by high-speed printing including gravure printing or flexographic printing with high productivity at low costs.

The electrically conductive circuit formed by using the electrically conductive ink of the invention is highly reliable under a high-temperature and high-humidity environment. Therefore, the electrically conductive circuit shows improved reliability after being mounted with an IC chip and enables maintenance of suitable electric conductivity, thus improving practical utility as a noncontact-type medium.

BEST MODE FOR CARRYING OUT THE INVENTION

Hereinafter, the present invention will be described in more detail by reference to embodiments, but the present invention is not limited to these embodiments without departure from the technical concept of the invention.

First, the electrically conductive ink of the present invention will be described in detail.

The electrically conductive ink of the invention comprises an electrically conductive material and a vinyl chloride/vinyl acetate/hydroxyalkyl (meth)acrylate copolymer resin.

The vinyl chloride/vinyl acetate/hydroxyalkyl (meth)acrylate copolymer resin contained in the electrically conductive ink of the invention is a component acting as a binder for the electrically conductive ink and is excellent in physical properties of coating film such as chemical resistant, water resisting, and adhesiveness to a base material such as paper or plastic film. Further, as the copolymer resin is excellent in stability under a high-temperature and high-humidity environment, it is highly reliable as a material for forming an electrically conductive circuit. By using the vinyl chloride/vinyl acetate/hydroxyalkyl (meth)acrylate copolymer resin as a binder for the electrically conductive ink in the present invention, the dispersibility and fluidity of the electrically conductive material can be improved. Therefore stability of the ink is made excellent and the electric conductivity of the coating is increased, so that lower circuit resistivity not achievable by other binder resins can be attained by drying at low temperatures in a short time.

As the vinyl chloride/vinyl acetate copolymer resin, a vinyl chloride/vinyl acetate binary copolymer resin and ternary polymers containing vinyl chloride and vinyl acetate have been known. However, an electrically conductive ink wherein a vinyl chloride/vinyl acetate/vinyl alcohol copolymer resin, other vinyl chloride/vinyl acetate copolymer resins than the vinyl chloride/vinyl acetate/hydroxyalkyl (meth)acrylate copolymer resin, or other polymer resins than the vinyl chloride/vinyl acetate copolymer are used as a binder, does not have an effect of improving the dispersibility and stability of an electrically conductive material.

The vinyl chloride/vinyl acetate/hydroxyalkyl (meth)acrylate copolymer resin is usually obtained by copolymerizing a vinyl chloride monomer, a vinyl acetate monomer and a hydroxyalkyl (meth)acrylate monomer. The alkyl group in the hydroxyalkyl (meth)acrylate monomer used as a copolymer monomer is preferably an ethyl group, a n-propyl group, an isopropyl group, a n-butyl group or the like, among which an isopropyl group is particularly preferred by reason of excellent chemical resistant and excellent adhesiveness to the substrate thereof.

The copolymerization ratio of the hydroxyalkyl (meth) acrylate monomer, the vinyl chloride monomer and the vinyl acetate monomer, that is, the hydroxyalkyl (meth)acrylate monomer/vinyl chloride monomer/vinyl acetate monomer ratio, is 0.1 to 25/70 to 95/0.1 to 15 (wt %), more preferably 5 to 20/75 to 90/1 to 10 (wt %), assuming that the total weight of the monomers is 100%. This is because when the copolymerization ratio of the hydroxyalkyl (meth) acrylate monomer is lower than 0.1% by weight, an electrically conductive circuit having a sufficiently low resistance cannot be obtained, while when the copolymerization ratio thereof is higher than 25% by weight, water resistant is deteriorated; when the copolymerization ratio of the vinyl chloride monomer is lower than 70% by weight, chemical resistant is deteriorated, while when the copolymerization ratio thereof is higher than 95% by weight, adhesiveness to a plastic base material is deteriorated; and when the copolymerization ratio of the vinyl acetate monomer is lower than 0.1% by weight, adhesiveness to a base material is deteriorated, while when the copolymerization ratio thereof is higher than 15% by weight, reliability under a high-temperature and high-humidity environment is deteriorated.

The molecular weight of the vinyl chloride/vinyl acetate/hydroxyalkyl (meth)acrylate copolymer resin is not particularly limited, but in consideration of the fluidity of the electrically conductive ink and of workability in forming an electrically conductive circuit with the electrically conductive ink, the number-average molecular weight (Mn) thereof is preferably about 5,000 to 45,000.

The content of the vinyl chloride/vinyl acetate/hydroxyalkyl (meth) acrylate copolymer resin in the electrically conductive ink is preferably 1 to 30% by weight, more preferably 2 to 25% by weight, based on the weight (100% by weight) of the total solid content of the electrically conductive ink.

The electrically conductive material contained in the electrically conductive ink of the invention is used to give electric conductivity to the ink. The electrically conductive material may be any electrically conductive material used conventionally in producing an electrically conductive ink, an electrically conductive paste, etc. Specific examples thereof include metals such as gold, silver, platinum, palladium, tungsten, titanium, indium, iridium, rhodium, cobalt, iron, nickel, silver-plated copper, a solver-copper complex, a silver-copper alloy and amorphous copper, among which silver is preferable in respect of electric conductivity and cost. As the electrically conductive material, it is also possible to use inorganic powder coated with the above metal, or metal oxides such as silver oxide, indium oxide, antimony oxide, zinc oxide, tin oxide, antimony-doped tin oxide and an indium-tin composite oxide, or carbon black, graphite etc. These electrically conductive materials may be used alone or as a mixture of two or more thereof. The particle diameter and content of the electrically conductive material used are not particularly limited, but vary depending on the type and shape of the electrically conductive material and the intended use of the electrically conductive coating or electrically conductive circuit, and may be in such a range that the electrically conductive coating or electrically conductive circuit can be formed by printing. For example, the average particle diameter of the electrically conductive material is preferably in the range of about 0.001 to 100 μm, and the amount thereof is generally about 2 to 50% by weight based on the solid content of the ink. When the shape of the electrically conductive material is not granular, the particle diameter is expressed as an average circle-equivalent diameter.

In the present invention, the electrically conductive fine particles (A) having an average particle diameter of 0.001 to 0.10 μm and the electrically conductive powders (B) having an average particle diameter or average circle-equivalent diameter of 0.5 to 10 μm are preferably used together as the electrically conductive material. The electrically conductive powders (B) are preferably flake-, scale-, plate-, sphere- or foil-shaped powders. The average particle diameters of the electrically conductive powder (A) and the electrically conductive powder (B) are values determined by a particle size distribution measuring device utilizing a dynamic light scattering method (for example, Nanotruck manufactured by Nikkiso Co., Ltd.). The average circle-equivalent diameter is used in place of an average diameter when the shape of the electrically conductive powder is non-spherical as described above. The average circle-equivalent diameter indicates an average diameter of circles having the same projected areas as those of the electrically conductive powders. This average circle-equivalent diameter is a value obtained by measuring the electrically conductive powders by using, for example, LUZEX manufactured by Nireco Corporation.

When the electrically conductive fine particles (A) and the electrically conductive powders (B) are used together, the fluidity of the electrically conductive ink is secured. As a consequence, the surface smoothness of a coating film of the electrically conductive ink and the lamination effect of the electrically conductive powders in a thin film are increased, and the coating film shows sufficient electric conductivity even if the coating film was dried under moderate conditions. In a coating film of the electrically conductive ink of the invention containing the electrically conductive fine particles (A) and the electrically conductive powders (B), when the electrically conductive powders (B) is, for example, flake-, scale-, plate-, sphere- or foil-shaped powders, the electroconductive powders are stacked in layers. Therefore, the electrically conductive circuit formed on a base material shows less change in resistance when bent or returned to the original shape and can maintain stable performance as a noncontact-type medium.

When a section of the coating film formed by using the electrically conductive ink of the invention containing the electrically conductive fine particles (A) and the electrically conductive powders (B) is observed by a transmission electron microscope, the electrically conductive fine particles (A) are almost uniformly distributed between layers of the electrically conductive powders (B) without being unevenly distributed in the coating. From this fact, it is thought that the electrically conductive fine particles (A) act as log rollers against the electrically conductive powders (B) so as to reduce frictional resistance among the electrically conductive powders (B) and to allow the electrically conductive powders (B) to be fairly stacked in layers, resulting in an increase in physical contact points among the electrically conductive powders (B), to bring about an improvement in the electric conductivity of the coating film. Simultaneous use of the electrically conductive fine particles (A) is also effective where heat treatment or heat/pressure treatment is carried out after formation of the electrically conductive circuit. This is because by the presence of the electrically conductive fine particles (A) in the vinyl chloride/vinyl acetate/hydroxyalkyl (meth)acrylate copolymer resin softened by heat treatment, the fluidity of the electrically conductive powders (B) can be secured even after drying or curing of the coating film, thereby permitting the electrically conductive powders (B) to be oriented and stacked in layers to improve electric conductivity.

As the fluidity of the electrically conductive ink is improved using together the electrically conductive fine particles (A) with the electrically conductive powders (B), an electrically conductive circuit can be form easily by the usual printing methods capable of mass production, such as flexo-graphic printing, gravure printing, gravure offset printing, rotary screen process printing and letter press. It is therefore possible to conduct a design utilizing existing facilities, that is, after usual printing such as picture etc. for improving a design to a noncontact-type medium, directly printing the electrically conductive circuit thereto. It is far superior in productivity, initial investment and running cost to the conventional method in which an electrically conductive circuit is formed by an etching method or a transfer method. Accordingly, by use of the electrically conductive ink of the invention comprising, as the electrically conductive material, (A) electrically conductive fine particles having an average particle diameter of 0.001 to 0.10 μm and (B) electrically conductive powders having an average particle diameter or average circle-equivalent diameter of 0.5 to 10 μm, the mass production and the stable production of noncontact-type media can be easily conducted and it makes the spread of low-cost noncontact-type media possible.

When the electrically conductive fine particles (A) are used in combination with the electrically conductive particles (B), the average particle diameter of the electrically conductive fine particles (A) is preferably 0.001 to 0.10 μm. This is because when the average particle diameter of the electrically conductive powders (A) is greater than 0.10 μm, either electric conductivity tends to reduce or an fluidity-giving effect on the ink tend to lower, thus causing, for example, deterioration in the stability of the ink, which is problematic in formation of electrically conductive circuits by usual printing methods such as flexo-graphic printing, gravure printing, gravure offset printing, rotary screen process printing and letter press. On the electrically conductive powders (A), it is more preferred to use electrically conductive fine particles having an average particle diameter of 0.001 to 0.08 μm in respect of the electric conductivity of a coating film and the stability and fluidity of the ink.

As the electrically conductive fine particles (A) having an average particle diameter of 0.001 to 0.10 μm, there can be used electrically conductive fine particles which are obtained by usual methods such as a liquid phase method, a gaseous phase method, a fusion method and an electrolytic method. It is possible to use, for example, metal fine particles protected with a polymer dispersant obtained by reducing metal ions in a solution in the presence of a polymer dispersant, as shown in JP-A 11-319538. Further, there are also usable metal fine particles coated thereon with a polymer compound formed by polymerizing monomers adhering on the surfaces of the metal fine particles, which are obtained by vaporizing the metal in a depressurized inert gas atmosphere and then mixing the monomer vapor with the metal vapor as described in JP-A 2002-266002. However, the electrically conductive fine particles (A) used in the present invention are not limited to the fine particles obtained by these specifically illustrated methods.

On the other hand, the electrically conductive powders (B) are electrically conductive powders having an average particle diameter (when the electrically conductive powders are spherical) or an average circle-equivalent diameter (when the electrically conductive powders are not spherical) of 0.5 to 10 μm. The electrically conductive powders (B) may be in any forms of flake-shaped, scale-shaped, plate-shaped, sphere-shaped, dendrite-shaped, foil-shaped etc., and of these, the flake-shaped form is particularly preferred from the viewpoint of the electric conductivity and fluidity of the ink. Even if primary powder diameters of the electrically conductive powders (B) have an average particle diameter or circle-equivalent diameter of 0.5 m or less, they have been aggregated. When a surveyed average particle diameter or average circle-equivalent diameter thereof is in the range defined above, these conductive powders can also be used. The electrically conductive powders (B) can be used as a mixture of two or more kinds thereof.

The flake-shaped powders or aggregated flake-shaped powders are preferably those powders having a tap density of 2.0 to 6.0 $g/cm^3$ and a specific surface area of 0.2 to 2.0 $m^2/g$. The tap density is measured by using a tap density measuring instrument based on ISO3953. The flake-shaped electrically conductive powders having a tap density of lower than 2.0 $g/cm^3$ are inferior in wetting property to the vinyl chloride/ vinyl acetate/hydroxypropyl (meth)acrylate copolymer resin, thus deteriorating the fluidity of the electrically conductive ink to lower printability. In a case of using the flake-shaped electrically conductive powders having a tap density of higher than 6.0 $g/cm^3$, the stability of the electrically conductive ink may be deteriorated to cause, for example, precipitation of the electrically conductive powders. When the electrically conductive powders having a specific surface area of smaller than 0.2 $m^2/g$ are used, the stability of the electrically conductive ink is deteriorated, while when the electrically conductive powders having a specific surface area of greater than 2.0 $m^2/g$ are used, the fluidity of the electrically conductive ink is deteriorated.

When the electrically conductive fine particle (A) and the electrically conductive powder (B) are together used, the electrically conductive fine particle (A) /electrically conductive powder (B) ratio by weight is preferably 3/97 to 50/50, more preferably 3/97 to 40/60, so that the resulting electrically conductive ink is excellent in printability and an electrically conductive circuit formed therefrom by a usual printing method has sufficiently low resistance. When the content of the electrically conductive fine particle (A) is lower than the above range, an effect of improving the fluidity of the electrically conductive ink is insufficient, while when the content is higher than the above range, physical properties of the coating film are lowered.

The content of the electrically conductive material in the electrically conductive ink (or the total content of the electrically conductive fine particle (A) and the electrically conductive powder (B) if they are used together) is preferably 70 to 95% by weight, more preferably 75 to 92% by weight, based on the weight (=100% by weight) of the total solid content of the electrically conductive ink. This is because when the content of the electrically conductive material is lower than 70% by weight, electric conductivity is not sufficient, while when the content is higher than 95% by weight, printability and electric conductivity are lowered.

Other resins or precursors thereof, compatible with the vinyl chloride/vinyl acetate/hydroxyalkyl (meth)acrylate copolymer resin, may be contained in the electrically conductive ink of the invention. These work for fixing the electrically conductive material to various base materials and maintaining the performance thereof as printing ink.

Other resins or precursors thereof described above can be used in an amount of 1 to 29% by weight, preferably 2 to 23% by weight, based on the weight (100 wt %) of the total solid content of the electrically conductive ink.

Examples of other resins include polyurethane resin, (unsaturated) polyester resin, alkyd resin, butyral resin, acetal resin, polyamide resin, acrylic resin, styrene/acrylic resin, polystyrene resin, nitrocellulose, benzyl cellulose, cellulose (tri)acetate, casein, shellac, gilsonite, rosin, rosin ester, styrene/maleic anhydride resin, polybutadiene resin, polyisoprene resin, polyvinyl chloride resin, polyvinylidene chloride resin, polyvinylidene fluoride resin, polyvinyl acetate resin, ethylene/vinyl acetate resin, vinyl chloride/vinyl acetate resin, vinyl chloride/vinyl acetate/maleic acid resin, fluorine resin, silicon resin, epoxy resin, phenoxy resin, phenol resin, maleic acid resin, urea resin, melamine resin, benzoguanamine resin, ketone resin, petroleum resin, chlorinated polyolefin resin, modified chlorinated polyolefin resin, and chlorinated polyurethane. One or more thereof may be used depending on the type of printing method, the type of base material used, and the intended use of noncontact media.

The resin precursors include compounds having an ethylenically unsaturated double bond, such as (meth) acrylic acid, (meth) acrylate compounds, and vinyl ether compounds. These compounds can be used alone or as a mixture of two or more thereof.

Among the (meth)acrylate compounds, the monofunctional (meth)acrylate compounds include methyl (meth)acrylate, ethyl (meth)acrylate, n-butyl (meth)acrylate, isobutyl (meth)acrylate, t-butyl (meth)acrylate, butanediol monoacrylate, 2-(dimethylamino)ethyl (meth)acrylate, 2-(diethylamino)ethyl methacrylate, 2-hydroxyethyl (meth)acrylate, 2-hydroxypropyl (meth)acrylate, 4-hydroxybutyl (meth) acrylate, 2-methoxyethyl acrylate, N-vinyl caprolactam, N-vinyl pyrrolidone, acryloyl morpholine, N-vinyl formamide, cyclohexyl (meth)acrylate, dicyclopentanyl (meth) acrylate, glycidyl (meth)acrylate, isobornyl (meth)acrylate, phenoxy (meth)acrylate, isodecyl (meth)acrylate, lauryl (meth)acrylate, tetrahydrofuryl (meth)acrylate, 2-phenoxyethyl (meth)acrylate, isooctyl (meth)acrylate, methoxytriethyleneglycolacrylate, 2-ethoxyethyl acrylate, 3-methoxybutyl acrylate, benzyl (meth)acrylate, 2-(2-ethoxyethoxy)ethyl acrylate, butoxyethyl acrylate, ethoxy diethylene glycol acrylate, methoxy dipropylene glycol acrylate, methyl phenoxy ethyl acrylate, dipropylene glycol (meth)acrylate, (meth) acryloyloxyethyl succinate, 2-(meth)acryloyloxyethyl 2-hydroxypropylphthalate, 2-acryloyloxyethylhexahydrophthalate, 2-hydroxy-3-acryloyloxypropyl (meth)acrylate, 2-methacryloyloxyethyl isocyanate, etc.

The multifunctional (meth)acrylate compounds include ethylene glycol di(meth)acrylate, diethylene glycol di(meth) acrylate, 1,6-hexanediol di(meth)acrylate, ethoxylated 1,6-hexanediol diacrylate, neopentylglycol di(meth)acrylate, ethoxylated neopentyl glycol di(meth)acrylate, propoxylated neopentylglycol di(meth)acrylate, tripropylene glycol di (meth) acrylate, polypropylene glycol diacrylate, 1,4-butanediol di (meth) acrylate, 1,9-nonanediol diacrylate, tetraethylene glycol diacrylate, 2-n-butyl-2-ethyl-1,3-propane diol diacrylate, dimethylol-tricyclodecane diacrylate, hydroxy pivalic acid neopentyl glycol diacrylate, 1,3-butylene glycol di (meth) acrylate, ethoxylated bisphenol A di(meth)acrylate, propoxylated bisphenol A di(meth)acrylate, cyclohexane dimethanol di(meth)acrylate, dimethylol dicyclopentane diacrylate, trimethylol propane triacrylate, ethoxylated trimethylol propane triacrylate, propoxylated trimethylol propane triacrylate, pentaerythritol triacrylate, tetramethylol propane triacrylate, tetramethylol methane triacrylate, pentaerythritol tetraacrylate, caprolactone modified trimethylol propane triacrylate, ethoxylated isocyanurate triacrylate, tri (2-hydroxyethyl isocyanurate) triacrylate, propoxylate glyceryl triacrylate, tetramethylol methane tetraacrylate, pentaerythritol tetraacrylate, ditrimethylol propane tetraacrylate, ethoxylated pentaerythritol tetraacrylate, dipentaerythritol hexaacrylate, neopentyl glycol oligoacrylate, 1,4-butanediol oligoacrylate, 1,6-hexanediol oligoacrylate, trimethylol propane oligoacrylate, pentaerythritol oligoacrylate, urethane acrylate, epoxy acrylate, polyester acrylate, rosin modified acrylate, etc.

Among the vinyl ether compounds, the monofunctional vinyl ether compounds include hydroxyethyl vinyl ether, hydroxybutyl vinyl ether, cyclohexane dimethanol monovinyl ether, cyclohexyl vinyl ether, etc.

The multifunctional vinyl ether compounds include ethylene glycol divinyl ether, diethylene glycol divinyl ether, triethylene glycol divinyl ether, pentaerythritol divinyl ether, propylene glycol divinyl ether, dipropylene glycol divinyl ether, neopentyl glycol divinyl ether, 1,4-butane diol divinyl ether, 1,6-hexane diol divinyl ether, trimethylol propane divinyl ether, 1,4-dihydroxycyclohexane divinyl ether, 1,4-dihydroxymethyl cyclohexane divinyl ether, bisphenol A diethoxy divinyl ether, glycerol trivinyl ether, sorbitol tetravinyl ether, trimethylol propane trivinyl ether, pentaerythritol trivinyl ether, pentaerythritol tetravinyl ether, dipentaerythritol hexavinyl ether, ditrimethylol propane tetravinyl ether, etc.

Compounds having ethylenically unsaturated double bonds other than the previously illustrated compounds include N-vinylacetamide, tris(acryloxyethyl) isocyanate, polyethylene glycol dimethacrylate, methoxy polyethylene glycol methacrylate, tribromophenyl (meth)acrylate, pentaerythritol diacrylate monostearate, 2-methacryloyloxyethyl hexahydrophthalate, stearyl acrylate, tetramethylpiperidyl methacrylate, etc.

When containing a liquid resin precursor, the electrically conductive ink of the invention can be prepared as a solventless ink curable with active energy rays such as UV ray and electron ray. The electrically conductive ink of the invention, when not containing a liquid resin precursor, can be prepared as a general thermal dry-type ink by incorporating a liquid medium for giving printability to the electrically conductive ink by dissolving the vinyl chloride/vinyl acetate/hydroxyalkyl (meth)acrylate copolymer resin and dispersing and stabilizing the electrically conductive material.

There can be used, as the liquid medium, an ester-based solvent, ketone-based solvent, glycol ether-based solvent, aliphatic solvent, aromatic solvent, alcohol-based solvent, ether-based solvent, water etc., depending on the type of base material on which the electrically conductive circuit is formed, the printing method, etc. A mixed solvent of two or more thereof can also be used. The liquid medium can be used in an amount of 0.1 to 5 times by weight to the weight of the total solid content of the electrically conductive ink.

Examples of the ester-based solvent used as a liquid medium of the electrically conductive ink include methyl acetate, ethyl acetate, n-propyl acetate, isopropyl acetate, n-butyl acetate, isobutyl acetate, sec-butyl acetate, (iso) amyl acetate, cyclohexyl acetate, ethyl lactate, and 3-methoxybutyl acetate, etc. Examples of the ketone-based solvent include acetone, methyl ethyl ketone, methyl isobutyl ketone, diisobutyl ketone, methyl amyl ketone, isophorone, cyclohexanone, etc. Examples of the glycol ether-based solvent include ethylene glycol monoethyl ether, ethylene glycol monoisopropyl ether, ethylene glycol monobutyl ether, diethylene glycol monoethyl ether, diethylene glycol mono-n-butyl ether, propylene glycolmonomethyl ether, propylene glycolmonoethyl ether, propylene glycol mono-n-propyl ether, propylene glycol mono-n-butyl ether, dipropylene glycol monomethyl ether, and dipropylene glycol mono-n-propyl ether and acetates of these monoethers, as well as dialkyl ethers such as diethylene glycol dimethyl ether, diethylene glycol diethyl ether, and dipropylene glycol dimethyl ether.

Examples of the aliphatic solvent include n-heptane, n-hexane, cyclohexane, methyl cyclohexane and ethyl cyclohexane, and examples of the aromatic solvent include toluene and xylene. Examples of the alcohol-based solvent include methanol, ethanol, n-propyl alcohol, isopropyl alcohol, n-butyl alcohol, isobutyl alcohol, sec-butyl alcohol, t-butyl alcohol, cyclohexanol, 3-methoxybutanol, diacetone alcohol, etc. Examples of the ether-based solvent include diisopropyl ether, tetrahydrofuran, 1,3-dioxolane, etc. Examples of another liquid medium include dimethyl carbonate, ethyl methyl carbonate, di-n-butyl carbonate, solvent naphtha, etc.

When the electrically conductive ink of the invention containing a resin precursor is cured by irradiation with electron ray, its radical polymerization is generated by molecular chain cleavage of the resin precursor (that is, a compound having an ethylenically unsaturated double bond). However, in the case of curing by irradiation with UV ray, a photopolymerization initiator is generally added to the electrically conductive ink.

As the photopolymerization initiator, there can be used benzophenone-, thioxanthone-, acetophenone-, benzoin-, acyl phosphine oxide-, bisimidazole-, acridine-, carbazole-phenone-, triazine-, and oxime-based photopolymerization initiators and the like. The photopolymerization initiator can be used in an amount of 1 to 20 parts by weight based on 100 parts by weight of the resin precursor.

Examples of the benzophenone-based photopolymerization initiator include benzophenone, benzoylbenzoic acid, 4-phenyl benzophenone, 4,4-diethylaminobenzophenone, 3,3-dimethyl-4-methoxybenzophenone, 4-benzoyl-4-methyldiphenylsulfide, etc.

Examples of the thioxanthone-based photopolymerization initiator include thioxanthone, 2-chlorothioxanthone, 2,4-diethylthioxanthone, 1-chloro-4-propoxythioxanthone, isopropylthioxanthone, etc.

Examples of the acetophenone-based photopolymerization initiator include 2-methyl-1-[(4-methylthio)phenyl]-2-morpholinopropan-1-one, 2-benzyl-2-dimethylamino-1-(4-morpholinophenyl)butanone-1,1-[4-(2-hydroxyethoxy)-phenyl]-2-hydroxy-2-methyl-1-propan-1-one, 2-hydroxy-2-methyl-1-phenylpropan-1-one, 1-hydroxy-cyclohexyl-phenyl-ketone, 2,2-dimethyl-2-hydroxy acetophenone, 2,2-dimethoxy-2-phenyl acetophenone, 4-phenoxydichloroacetophenone, diethoxyacetophenone, 1-hydroxy cyclohexyl phenyl ketone, etc.

Examples of the benzoin-based photopolymerization initiator include benzoin methyl ether, benzoin isobutyl ether, benzyl methyl ketal, etc.

Examples of the acyl phosphine oxide-based photopolymerization initiator include 2,4,6-trimethyl benzoyl diphenyl phosphine oxide, bis(2,4,6-trimethylbenzoyl)acyl phosphine oxide, etc.

The electrically conductive ink of the invention containing a resin precursor may further contain a photopolymerization accelerator and a sensitizer in addition to the photopolymerization initiator. Examples of the photopolymerization accelerator and the sensitizer include aliphatic and aromatic amines such as triethanolamine, triisopropanolamine, 4,4-dimethylaminobenzo-phenone, ethyl 2-dimethylaminobenzoate, and (n-butoxy)ethyl-4-dimethylaminobenzoate.

The electrically conductive ink of the invention containing a resin precursor may also contain a (heat) polymerization inhibitor, for the purpose of improving the stability of the electrically conductive ink. Examples of the (heat) polymerization inhibitor include hydroquinone, hydroquinone monomethyl ether, p-benzoquinone, 2,6-t-butyl-p-cresol, 2,3-dimethyl-6-t-butylphenol, anthraquinone, phenothiazine, and N-nitrosophenyl hydroxylamine aluminum salt.

The electrically conductive ink of the invention can contain a wide variety of usually used additives such as a plasticizer, a lubricant, a dispersant, a leveling agent, a defoaming agent, an antistatic agent, an antioxidant and a chelating agent as necessary. Further, organic and inorganic fillers used usually may be contained in such a range that the object of the present invention is not hindered.

The electrically conductive ink of the invention can be prepared as follows. That is, the vinyl chloride/vinyl acetate/hydroxyalkyl (meth)acrylate copolymer resin and the electrically conductive material are weighed out, followed by adding another resin and/or a compound having an ethylenically unsaturated double bond, which are selected depending on the intended use and a base material. Further, added thereto are additives such as a plasticizer, a lubricant, a dispersant, a leveling agent, a defoaming agent, an antistatic agent, an antioxidant and a chelating agent as necessary. The mixture is dispersed by a method known in the art, for example by using a mixer, a dissolver, Hoover Muller, a triple-roll mill, or a sand mill to prepare the ink.

Finally, description will be given to a noncontact-type medium provided with an electrically conductive circuit formed by using the electrically conductive ink of the invention and with an IC chip mounted in the state of being electrically conducted to the electrically conductive circuit.

The electrically conductive ink of the invention is printed on one side or both sides of a base material such as paper or plastics selected depending on the intended use by a printing method known in the art such as flexo-graphic printing, gravure printing, gravure offset printing, offset printing, rotary screen process printing or letter press to form an electrically conductive circuit. After printing, the ink may be dried by usual post-treatment according to the printing method used. For example, when the ink curable with active energy rays such as UV ray or electron ray or the ink curable by heating is used as the ink curable by the post-treatment, the ink may be cured and dried by UV ray or electron ray treatment or by heat treatment after printing. If the electrically conductive ink is not such special ink, the ink can be heated at a temperature suitable for promoting evaporation of the solvent, for example, at a temperature of about 50° C., to form an electrically conductive coating or an electrically conductive circuit.

As the paper base material, it is possible to use various processed papers including not only coated paper and uncoated paper but also synthetic paper, polyethylene-coated paper, impregnated paper, water-resistant processed paper, insulating processed paper, and elasticized paper etc. Of these, coated paper and processed paper are preferred for attaining stable resistance when used in noncontact-type media. In the case of coated paper, paper having higher smoothness is preferred. The higher the smoothness of the paper is, the more an electrically conductive circuit with stable resistance is obtained.

As the plastic base material, it is possible to use base materials composed of plastics used in usual tags and cards, such as polyester, polyethylene, polypropylene, cellophane, cellulose (tri)acetate, polyvinyl chloride, polyvinylidene chloride, polystyrene, polyvinyl alcohol, polycarbonate, an ethylene/vinyl acetate copolymer, an ethylene/ethyl (meth)

acrylate copolymer, an ethylene/acrylic copolymer, an ethylene/vinyl alcohol copolymer, nylon, polyimide, and polycarbonate.

An electrically conductive circuit formed by using the electrically conductive ink of the invention is subjected to heat treatment or heat/pressure treatment, thereby reducing the roughness of the surface of the electrically conductive circuit and further reducing the resistance thereof. The reason is that the vinyl chloride/vinyl acetate/hydroxyalkyl (meth)acrylate copolymer resin is softened by heating and the electrically conductive material therein is fluidized to increase the orientation of the electrically conductive material. This makes the surface of the electrically conductive circuit smooth and simultaneously increases the number of physical contact points between the electrically conductive materials. Although heat/pressure treatment is preferable for attaining lower resistance, either heat treatment or heat/pressure treatment may be selected depending on the type of the base material used.

In the case of heat treatment, the resistance of the electrically conductive circuit on a base material obtained by usual heat-drying or by curing-drying with an active energy ray can be reduced by heat-treatment, for example, at a temperature of 50 to 150° C. When the heating temperature is lower than 50° C., the electrically conductive material cannot be sufficiently fluidized and therefore hardly oriented, to fail to attain a sufficient effect of reducing the resistance in a short time. However, even at 50° C., the resistance can be decreased by maintaining the print in an oven for 3 days. On the other hand, when the heating temperature is 50 to 150° C., the electrically conductive circuit print is passed several times through a drying oven at such a speed as not to deform the base material, thereby similarly reducing the resistance. A heating temperature of higher than 150° C. is not preferable because deformation of the base material is easily caused.

It is preferable that the heating temperature and time are established depending on the type of the base material within the above-mentioned ranges, such that the base material is not influenced.

The heat treatment may be carried out by using a usual hot-air oven, a far-infrared oven, a hot-air heater, a heating roll or the like. In a case of using the electrically conductive ink curable with an active energy ray, the heat treatment can be carried out before or after curing of the electrically conductive circuit.

When ultraviolet irradiation is carried out in addition to the heating treatment described above, the resistance can be further reduced. This is because particularly when silver is used as the electrically conductive material, silver has an absorption in an UV region in the vicinity of 300 to 400 nm, so that UV energy applied can be converted into heat energy with which the base material is subjected to treatment similar to heat treatment. This UV irradiation treatment may be carried out either before or after heat treatment.

When the heat/pressure treatment is carried out, the treatment may be carried out in such a range that the base material is not influenced by the treatment. The treatment temperature is preferably at 50 to 150° C. The heat/pressure treatment can be carried out with a press rolling machine, a pressing machine, a laminator or the like. The pressure treatment may be carried out in such a range that the base material used is not influenced, preferably at a pressure of 0.5 to 2.0 MPa for a time in the range of 10 seconds to 10 minutes. This is because at a pressure of lower than 0.5 MPa, an effect of reducing resistance is low, while at a pressure of higher than 2.0 MPa, the base material is deformed. When the pressurization time is shorter than 10 seconds, an effect of reducing resistance is low, while when the pressurization time is longer than 10 minutes, the base material is easily deformed and simultaneously productivity is deteriorated. When a press rolling machine is used, the linear load of the roll is preferably in the range of 1 to 25 kg/cm. This is because when the linear load is lower than 1 kg/cm, the effect is low, while when the linear load is higher than 25 kg/cm, the base material is deformed. The base material can be pressed through the machine at a rate in the range of 1 to 30 m/min.

By conducting the heat/pressure treatment in the range defined above, the arithmetic average surface roughness Ra of the electrically conductive circuit can be reduced to 3.0 μm or less. This secures smoothness and simultaneously increases the regular orientation of the electrically conductive material to stabilize the resistance of the electrically conductive circuit. The arithmetic average roughness Ra is preferably lower, but when the roughness Ra is greater than 3.0 μm, an reduction effect of resistance is low and the resistance is not stabilized. Thus, the heat/pressure treatment is carried out preferably such that the roughness Ra is reduced to 3.0 μm or less. As used herein, the arithmetic average roughness Ra refers to the roughness defined in JIS B 0601-1994.

In a step before formation of the electrically conductive circuit, the base material may be coated with an anchor coating agent or various varnishes for the purpose of improving the adhesiveness of the base material to the electrically conductive circuit. After the electrically conductive circuit is formed, the electrically conductive circuit may be coated with an overprint varnish, various coating agents, etc. for the purpose of protecting the circuit. As these varnishes and coating agents, both those of usual heat dry type and those of active energy ray curing type can be used.

Alternatively, the electrically conductive circuit may be coated thereon with an adhesive followed by bonding via the adhesive a paper base material or plastic film having a printing picture etc. printed thereon, or may be laminated with plastics by melt extrusion, to obtain noncontact-type media. As a matter of course, a base material previously coated with a pressure-sensitive adhesive or an adhesive can also be used.

EXAMPLES

Hereinafter, the present invention is described in more detail by reference to the Examples, but the present invention is not limited thereto. In the Examples, "parts" refers to "parts by weight", and "%" refers to "% by weight".

Example 1

85 parts of flake-shaped silver powder ("AgC-A" with an average circle-equivalent diameter of 3.7 μm, a tap density of 3.1 g/cm$^3$, and a specific surface area of 0.8 m$^2$/g, manufactured by Fukuda Metal Foil & Powder Co., Ltd.), 15 parts of a vinyl chloride/vinyl acetate/hydroxypropyl acrylate copolymer resin (vinyl chloride/vinyl acetate/2-hydroxypropyl acrylate=83/3/14 (% by weight), number-average molecular weight 30,000), and 53.8 parts of a liquid medium consisting of a mixture of toluene and methyl ethyl ketone (toluene/methyl ethyl ketone ratio by weight=1/1) were mixed and stirred with a dissolver for 30 minutes to give an electrically conductive ink. Using this electrically conductive ink, an electrically conductive circuit pattern of 3 mm in width was printed on a polyester film ("Emblet SA" with a thickness of 50 μm, manufactured by Unitika Ltd.) by a small gravure printing machine and then dried to give an electrically conductive circuit having a coating thickness of 5 μm. The drying temperature in the printing machine was set at 50° C. that was an actually measured value.

Example 2

4 parts of silver fine particle dispersion ("247160P-2" with an average particle diameter 0.05 µm and a silver content of 60%, manufactured by NanoPowders Industries), 77.6 parts of flake-shaped silver powder ("AgC-A" with an average circle-equivalent diameter 3.7 µm, a tap density of 3.1 g/cm$^3$, and a specific surface area of 0.8 m$^2$/g, manufactured by Fukuda Metal Foil & Powder Co., Ltd.), 20 parts of a vinyl chloride/vinyl acetate/hydroxypropyl acrylate copolymer resin (vinyl chloride/vinyl acetate/2-hydroxypropyl acrylate=83/3/14 (% by weight), number-average molecular weight 30,000), and 52.2 parts of a liquid medium consisting of a mixture of ethyl acetate and 1,3-dioxolane (ethyl acetate/1,3-dioxolane ratio by weight=1/1) were mixed and stirred with a dissolver for 30 minutes to give an electrically conductive ink. Using this electrically conductive ink, an electrically conductive circuit pattern of 3 mm in width was gravure-printed in the same manner as in Example 1 to give an electrically conductive circuit having a coating thickness of 5 µm.

Example 3

90 parts of flake-shaped silver powder ("AgC-A" with an average circle-equivalent diameter of 3.7 µm, a tap density of 3.1 g/cm$^3$, and specific surface area 0.8 m$^2$/g, manufactured by Fukuda Metal Foil & Powder Co., Ltd.), 4 parts of a vinyl chloride/vinyl acetate/hydroxypropyl acrylate copolymer resin (vinyl chloride/vinyl acetate/2-hydroxypropyl acrylate=89/5/6 (% by weight), number-average molecular weight 30,000), 6 parts of polyurethane resin ("Polyurethane 75" manufactured by Arakawa Chemical Industries, Ltd.), and 42.9 parts of a liquid medium consisting of a mixture of isopropyl alcohol and ethyl acetate (isopropyl alcohol/ethyl acetate ratio by weight=8/2) were mixed and stirred with a dissolver for 30 minutes to give an electrically conductive ink. Using this electrically conductive ink, an electrically conductive circuit pattern of 3 mm in width was flexo-graphic printed on a polyester film ("Emblet SA" with a thickness of 50 µm, manufactured by Unitika Ltd.) by a CI-type flexo-graphic press ("SOLOFLEX", Anilox: 120 lines/inch, manufactured by W&H) to give an electrically conductive circuit having a coating thickness of 4 µm. The drying temperature in the printing machine was set at 50° C. that was an actually measured value.

Example 4

The conductor circuit obtained in Example 2 was subjected to heat roll press treatment by a pressure-bonding machine under the conditions of a roll temperature of 120° C., a press pressure of 5 kg/cm and a line speed of 15 m/min.

Example 5

80 parts of flake-shaped silver powder ("AgC-A" with an average circle-equivalent diameter of 3.7 µm, a tap density of 3.1 g/cm$^3$, and a specific surface area of 0.8 m$^2$/g, manufactured by Fukuda Metal Foil & Powder Co., Ltd.), 4 parts of a vinyl chloride/vinyl acetate/hydroxypropyl acrylate copolymer resin (vinyl chloride/vinyl acetate/2-hydroxypropyl acrylate=83/3/14 (% by weight), number-average molecular weight 30,000), 16 parts of polyester acrylate ("Ebecryl 80" manufactured by Daicel-UCB Company Ltd.), and 2 parts of a photopolymerization initiator ("Irgacure 907" manufactured by Ciba Specialty Chemicals) were mixed and stirred with a dissolver for 30 minutes under heating at 35° C. to give an electrically conductive ink. Using this electrically conductive ink, an electrically conductive circuit pattern of 3 mm in width was printed by the CI-type flexo-graphic press in the same manner as in Example 3 and then irradiated with UV light regulated at 300 mJ/cm$^2$ in total. Then, the electrically conductive circuit pattern was subjected to heat/pressure treatment in the same manner as in Example 4 to give an electrically conductive circuit having a coating thickness of 7 µm.

Example 6

The conductor circuit obtained in Example 1 was irradiated at a line speed of 20 m/min with UV ray from an 8-kW metal halide lamp.

Example 7

85 parts of spherical silver powder ("SPQ 08S" with an average particle diameter of 1.5 m, a tap density of 5.0 g/cm$^3$, and a specific surface area of 0.7 m$^2$/g, manufactured by Mitsui Mining And Smelting Company, Limited), 15 parts of a vinyl chloride/vinyl acetate/hydroxypropyl acrylate copolymer resin (vinyl chloride/vinyl acetate/2-hydroxypropyl acrylate=83/3/14 (% by weight), number-average molecular weight 30,000), and 53.8 parts of a liquid medium consisting of a mixture of toluene and methyl ethyl ketone (toluene/methyl ethyl ketone ratio by weight=1/1) were mixed and stirred with a dissolver for 30 minutes to give an electrically conductive ink. Using this electrically conductive ink, an electrically conductive circuit pattern of 3 mm in width was gravure-printed in the same manner as in Example 1 to give an electrically conductive circuit having a coating thickness of 5 µm.

Comparative Example 1

85 parts of flake-shaped silver powder ("AgC-A" with an average circle-equivalent diameter of 3.7 µm, a tap density of 3.1 g/cm$^3$, and a specific surface area of 0.8 m$^2$/g, manufactured by Fukuda Metal Foil & Powder Co., Ltd.), 15 parts of a vinyl chloride/vinyl acetate copolymer resin (vinyl chloride/vinyl acetate=86/14 (% by weight), number-average molecular weight 27,000), and 53.8 parts of a liquid medium consisting of a mixture of toluene and methyl ethyl ketone (toluene/methyl ethyl ketone ratio by weight=1/1) were mixed and stirred with a dissolver for 30 minutes to give an electrically conductive ink. Using this electrically conductive ink, an electrically conductive circuit pattern of 3 mm in width was printed in the same manner as in Example 1 and then subjected to heat/pressure treatment in the same manner as in Example 4 to give an electrically conductive circuit having a coating thickness of 5 µm.

Comparative Example 2

85 parts of flake-shaped silver powder ("AgC-224" with an average circle-equivalent diameter of 11.2 μm, a tap density of 4.4 g/cm$^3$, and a specific surface area 0.3 m$^2$/g, manufactured by Fukuda Metal Foil & Powder Co., Ltd.), 15 parts of a vinyl chloride/vinyl acetate/polyvinyl alcohol copolymer resin (vinyl chloride/vinyl acetate/polyvinyl alcohol=90/4/6 (% by weight), number-average molecular weight 27,000), and 53.8 parts of a liquid medium consisting of a mixture of toluene and methyl ethyl ketone (toluene/methyl ethyl ketone ratio by weight=1/1) were mixed and stirred with a dissolver for 30 minutes to give an electrically conductive ink. Using this electrically conductive ink, an electrically conductive circuit pattern of 3 mm in width was printed in the same manner as in Example 1 to give an electrically conductive circuit having a coating of 5 μm in thickness.

Comparative Example 3

90 parts of flake-shaped silver powder ("AgC-A" with an average circle-equivalent diameter of 3.7 μm, a tap density of 3.1 g/cm$^3$, and a specific surface area of 0.8 m$^2$/g, manufactured by Fukuda Metal Foil & Powder Co., Ltd.), 10 parts of polyurethane resin ("Polyurethane 75" manufactured by Arakawa Chemical Industries, Ltd.), and 42.9 parts of a liquid medium consisting of a mixture of isopropyl alcohol and ethyl acetate (isopropyl alcohol/ethyl acetate ratio by weight=8/2) were mixed and stirred with a dissolver for 30 minutes to give an electrically conductive ink. Using this electrically conductive ink, an electrically conductive circuit pattern of 3 mm in width was printed in the same manner as in Example 3 to give an electrically conductive circuit having a coating of 4 μm in thickness.

Comparative Example 4

85 parts of spherical silver powder ("SPQ 08S" with an average particle diameter of 1.5 p, a tap density of 5.0 g/cm$^3$, and a specific surface area of 0.7 m$^2$/g, manufactured by Mitsui Mining And Smelting Company, Limited), 15 parts of a vinyl chloride/vinyl acetate copolymer resin (vinyl chloride/vinyl acetate=86/14 (% by weight), number-average molecular weight 27,000), and 53.8 parts of a liquid medium consisting of a mixture of toluene and methyl ethyl ketone (toluene/methyl ethyl ketone ratio by weight=1/1) were mixed and stirred with a dissolver for 30 minutes to give an electrically conductive ink. Using this electrically conductive ink, an electrically conductive circuit pattern of 3 mm in width was gravure-printed in the same manner as in Example 1 to give an electrically conductive circuit having a coating thickness of 5 μm.

The electrically conductive circuits obtained in the Examples and Comparative Examples above were evaluated for their surface roughness, volume resistivity, IC tag communication and reliability under a high-temperature and high-humidity environment by the following methods. The results are shown in Table 1.

[Surface Roughness]

The electrically conductive circuit was measured for its arithmetic surface roughness Ra (μm) by using a laser focus displacement meter (LT-8010, manufactured by Keyence Corporation).

[Volume resistivity]

The electrically conductive circuit was pinched at 4 positions at 30-mm intervals and measured for its resistance with a 4-probe resistance measuring instrument (DR-1000 CU, manufactured by Sanwa Electric Instrument Co. Ltd.). The film thickness of the electrically conductive circuit was measured with a film thickness meter (MH-15M, manufactured by Sendai Nikon Corporation), and its volume resistivity was calculated from the resistance obtained and the film thickness.

[IC Tag Communication]

An IC chip was mounted to the electrically conductive circuit by using an IC strap manufactured by Alien Technology, and the communication distance (cm) from the obtained IC tag was measured by using a 2.45-GHz passive development kit manufactured by the same company.

[Reliability in High-Temperature and High-Humidity Environment]

The IC tag obtained by the method described above was left for 500 hours in an environmental test laboratory at 85° C. in 85% RH. The IC tag was then taken out from the laboratory and left at room temperature. The IC tag after a high-temperature and high-humidity test was measured again for communication distance (cm) by using the 2.45-GHz passive development kit. A change in communication distance before and after the IC tag was left in the high-temperature and high-humidity environment was evaluated according to the following criteria:

○: Less than 5% change in communication distance.

Δ: 5 to 30% change in communication distance.

χ: Not capable of communication.

Table 1: See Appendix.

Electrically conductive circuits having a volume resistivity on the order of 10$^{-5}$ Ω·cm) could be formed by the heat drying method and the UV drying method using the electrically conductive inks obtained in Examples 1 to 7. It can be assumed that the effect is attributed to the use of the vinyl chloride/vinyl acetate/hydroxyalkyl (meth)acrylate copolymer resin. Any electrically conductive circuits using these inks were superior in reliability under a high-temperature and high-humidity environment.

Further, fluidity of inks was improved using together the electrically conductive fine particles with the electrically conductive powders in electrically conductive inks obtained in Examples 2 and 4, thus increasing smoothness of the circuit surface. It contributed to lower resistance of the electrically conductive circuit and improvement of communication distance. Furthermore, in Example 4, the layer stack effect of the electrically conductive powders was improved by the heat/pressure treatment, thus achieving reduction in resistivity reaching 1×10$^{-5}$ Ω·cm.

On the other hand, the electrically conductive inks obtained in Comparative Examples 1 to 4 did not contain the vinyl chloride/vinyl acetate/hydroxypropyl (meth)acrylate copolymer resin and thus failed to attain an effect of sufficiently reducing resistance and the smoothness of electrically conductive circuit surfaces. Accordingly, the effect of the heat/pressure treatment was not sufficient, and stable communication performance could not be demonstrated.

TABLE 1

| Starting materials | Type and characteristic value | Ex 1 | Ex 2 | Ex 3 | Ex 4 | Ex 5 | Ex 6 | Ex 7 | Comp 1 | Comp 2 | Comp 3 | Comp 4 |
|---|---|---|---|---|---|---|---|---|---|---|---|---|
| Formulation (parts) | | | | | | | | | | | | |
| Electrically conductive particle (A) | Silver fine particle dispersion, average particle diameter: 0.05 µm | | 4 | | 4 | | | | | | | |
| Electrically conductive powder (B) | Flake-shaped silver powder, average circle-equivalent diameter: 3.7 µm | 85 | 77.6 | 90 | 77.6 | 80 | 85 | | 85 | | 90 | |
| | Flake-shaped silver powder, average circle-equivalent diameter: 11.2 µm | | | | | | | | | 85 | | |
| | Spherical silver powder, average particle diameter: 1.5 µm | | | | | | | 85 | | | | 85 |
| Resin | Vinyl chloride/vinyl acetate/2-hydroxypropyl acrylate (83/3/14) copolymer resin | 15 | 20 | | 20 | 4 | 15 | 15 | | | | |
| | Vinyl chloride/vinyl acetate/2-hydroxypropyl acrylate (89/5/6) copolymer resin | | | 4 | | | | | | | | |
| | Vinyl chloride/vinyl acetate (88/14) copolymer resin | | | | | | | | 15 | | | 15 |
| | Vinyl chloride/vinyl acetate/polyvinyl alcohol (90/4/6) copolymer resin | | | | | | | | | 15 | | |
| | Polyurethane resin | | | 6 | | | | | | | 10 | |

TABLE 1-continued

Formulation of electrically conductive ink and evaluation results

| | | | | | | | | | | | | | |
|---|---|---|---|---|---|---|---|---|---|---|---|---|---|
| Resin precursor | Polyester acrylate | | | | | 16 | | | | | | | |
| Liquid medium | | 53.8 | 52.2 | 42.9 | 52.2 | | 53.8 | 53.8 | 53.8 | 53.8 | 42.9 | 53.8 |
| Photopoly-merization initiator | Irgacure 907 | | | | | 2 | | | | | | | |

| | Items | Conditions | | | | | | | | | | | |
|---|---|---|---|---|---|---|---|---|---|---|---|---|---|
| Method and Evaluation Results | <Drying/curing method> | Heat: Hot-air drying oven 50° C., UV: 300 mJ/cm² | Heat | Heat | Heat | Heat | UV | Heat & UV | Heat | Heat | Heat | Heat | Heat |
| | <Printing method> | | Gravure | Gravure | Gravure | Gravure | Flexo-graphic | Gravure | Gravure | Gravure | Gravure | Flexo-graphic | Gravure |
| | <Drying conditions> | Measured temperature/time | 50° C./3 sec. | 50° C./3 sec. | 50° C./4 sec. | 50° C./3 sec. | —/— | 50° C./3 sec. | 50° C./3 sec. | 50° C./3 sec. | 50° C./3 sec. | 50° C./4 sec. | 50° C./3 sec. |
| | <Heat/pressure treatment> | Heat roll press treatment | Not treated | Not treated | Not treated | Treated | Treated | Not treated | Not treated | Treated | Not treated | Not treated | Not treated |
| | Surface roughness | Arithmetic surface roughness Ra μm) | 1.2 | 0.7 | 1.5 | 0.3 | 0.8 | 1.0 | 0.9 | 2.5 | 4.0 | 3.5 | 2.8 |
| | Volume resistivity | Measurement with 4-probe method Ω · cm) | $3.6 \times 10^{-5}$ | $4.1 \times 10^{-5}$ | $5.0 \times 10^{-5}$ | $1.0 \times 10^{-5}$ | $3.8 \times 10^{-5}$ | $2.2 \times 10^{-5}$ | $3.5 \times 10^{-5}$ | $3.2 \times 10^{-4}$ | $7.4 \times 10^{-4}$ | $1.6 \times 10^{-3}$ | $2.5 \times 10^{-4}$ |
| | IC tag communication test | Communication distance (cm) by IC tag for 2.45 GHz | 35 | 45 | 35 | 45 | 35 | 40 | 35 | 15 | 10 | F | 15 |
| | Reliability in high-temperature and high-humidity environment | Communication after left at 85° C. in 85% RH for 500 hours | ○ | ○ | ○ | ○ | ○ | ○ | ○ | Δ | x | x | Δ |

The invention claimed is:

1. An electrically conductive ink comprising an electrically conductive material and a vinyl chloride/vinylacetate/hydroxyalkyl (meth)acrylate copolymer resin, wherein the electrically conductive material is silver and the copolymerization ratio of the vinyl chloride/vinyl acetate/hydroxyalkyl (meth)acrylate copolymer resin is 70 to 95 wt % of vinyl chloride, 0.1 to 15 wt % of vinyl acetate, and 0.1 to 25 wt % of hydroxyalkyl(meth)acrylate.

2. The electrically conductive ink according to claim 1, wherein the electrically conductive material comprises (A) electrically conductive fine particles having an average particle diameter of 0.001 to 0.10 μm and (B) electrically conductive powders having an average particle diameter or average circle-equivalent diameter of 0.5 to 10 μm.

3. The electrically conductive ink according to claim 2, wherein the electrically conductive powders (B) are flake-, scale-, plate-, sphere- or foil-shaped.

4. The electrically conductive ink according to claim 1, wherein the electrically conductive ink further contains an ethylenically unsaturated double bond-containing compound and a photopolymerization initiator.

5. An electrically conductive circuit, which is formed from the electrically conductive ink described in any one of claims 1 and 2 to 4.

6. The electrically conductive circuit according to claim 5, wherein an arithmetic average surface roughness Ra of the circuit is 3.0 μm or less.

7. A method of forming an electrically conductive circuit comprising formation on a base material by printing with the electrically conductive ink described in any one of claims 1 and 2 to 4.

8. The method of forming an electrically conductive circuit according to claim 7, wherein the printing is flexo-graphic printing, gravure printing, gravure offset printing, rotary screen process printing or letter press.

9. The method of forming an electrically conductive circuit according to claim 7, wherein the formed electrically conductive circuit is further heated, pressurized, heated/pressurized, or irradiated with UV ray to reduce an arithmetic average roughness Ra of the surface of the electrically conductive circuit to 3.0 μm or less.

10. A noncontact-type medium comprising an electrically conductive circuit formed on a base material by using the electrically conductive ink of any one of claims 1 and 2 to 4 and an IC chip mounted in the state of being electrically conducted to the electrically conductive circuit.

11. The noncontact-type medium according to claim 10, wherein, the arithmetic average roughness Ra of the surface of the electrically conductive circuit formed on a base material is 3.0 μm or less.

* * * * *